US008041549B2

(12) United States Patent
Matsumura et al.

(10) Patent No.: US 8,041,549 B2
(45) Date of Patent: Oct. 18, 2011

(54) ANALYZATION APPARATUS AND CONTROL METHOD THEREOF

(75) Inventors: Dai Matsumura, Kawasaki (JP); Yasuo Katano, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 911 days.

(21) Appl. No.: 12/020,782

(22) Filed: Jan. 28, 2008

(65) Prior Publication Data

US 2008/0184153 A1 Jul. 31, 2008

(30) Foreign Application Priority Data

Jan. 31, 2007 (JP) ................................ 2007-022235

(51) Int. Cl.
G06F 17/10 (2006.01)
G06F 17/11 (2006.01)
G06G 7/48 (2006.01)
G06G 7/68 (2006.01)
G06T 17/00 (2006.01)
G06T 17/10 (2006.01)
G09G 5/02 (2006.01)

(52) U.S. Cl. ................. 703/6; 703/2; 345/420; 345/592
(58) Field of Classification Search .................. 703/2, 6; 345/420, 592; 715/768
See application file for complete search history.

(56) References Cited

U.S. PATENT DOCUMENTS
7,292,255 B2 * 11/2007 Doan et al. .................... 345/629

FOREIGN PATENT DOCUMENTS
JP 07-254003 10/1995

OTHER PUBLICATIONS

Djurcilov et al. "Visualizing scalar volumetric data with uncertainty" 2002, Computers & Graphics, vol. 26, pp. 239-248.*
Jones, Derek K. "Determining and Visualizing Uncertainty in Estimates of Fiber Orientation From Diffusion Tensor MRI", 2003, Magnetic Resonance in Medicine, vol. 49, pp. 7-12.*
Pang, Alex. "Visualizing Uncertainty in Geo-spatial Data", Sep. 20, 2001, 14 pages.*
MacEachren et al. "Visualizing Geospatial Information Uncertainty: What We Know and What We Need to Know", 2005, Cartography and Geographic Information Science, vol. 32, No. 3, pp. 139-160.*
Newman et al. "On visualizing uncertainty in volumetric data: techniques and their evaluation", 2004, Journal of Visual Languages and Computing vol. 15, pp. 463-491.*
Alshoaibi et al. "Finite element simulation of stress intensity factors in elastic-plastic crack growth" Journal of Zhejiang University Science A, 2006, vol. 7, No. 8, pp. 1336-1342.*
Cho et al. "A management on mesh modelling for finite element analysis in casting simulation" Jan.-Feb. 2007, Journal of Achievements in MAterials and Manufacturing Engineering, vol. 20, Issues 1-2, pp. 335-338.*

* cited by examiner

Primary Examiner — Kamini S Shah
Assistant Examiner — Suzanne Lo
(74) Attorney, Agent, or Firm — Cowan, Liebowitz & Latman, P.C.

(57) ABSTRACT

An analyzation apparatus which performs an analysis simulation in accordance with analysis condition data. An analysis condition modeling unit generates an analysis condition model data by assigning an analysis condition to each region of a three-dimensional model represented with analysis object model data of the analysis simulation based on analysis condition data set for the analysis simulation. A rendering unit renders the three-dimensional model represented with the analysis condition model data and displays the three-dimensional model on a display device.

4 Claims, 14 Drawing Sheets

ANALYZATION APPARATUS AND CONTROL METHOD THEREOF

BACKGROUND OF THE INVENTION

1. Field of the Invention

The present invention relates to an analyzation apparatus to perform an analysis simulation and its control method, and more particularly, to a display method for the apparatus and the control method.

2. Description of the Related Art

Presently, to develop high quality products at low cost and high speed, a technique for performing a virtual test on a computer before completion of the actual prototype is important. For such a virtual test, a technique for analysis simulation of structure, fluid, heat, stress and the like has been established. Further, a technique for three-dimensionally visualizing the results of these analysis simulations (hereinafter, "analysis results") has been established. A product developer and a designer can perform a virtual test by observation of three-dimensionally visualized analysis results (see Japanese Patent Application Laid-Open No. 07-254003).

As described above, as the technique for visualization of analysis results has been developed, there is a tradeoff between the time required for execution of the analysis simulation and the precision of the analysis result. The elaborateness of analysis conditions such as model data shape, mesh division density, mechanical characteristic, physical characteristic, chemical characteristic, temperature distribution, and analysis boundary condition are correlated with the amount of calculations. That is, upon analysis simulation, if the analysis condition is set in detail, the analysis simulation is performed on a condition closer to reality, and therefore, the precision of analysis result is high. On the other hand, as the amount of calculation is increased due to the detailed setting of the analysis condition, the calculation time is increased.

Accordingly, a user who executes an analysis simulation (hereinafter, an "analysis user") sets an optimum analysis condition in consideration of trade-off between time and precision, and performs the analysis simulation. Next, as one of the analysis conditions, the mesh division density of model data will be described. When an analysis condition is set so as to complete analysis simulation calculation within a predetermined analysis time, it may be difficult to mesh-divide all the model data in high density. Accordingly, a region with priority may be mesh-divided in high density, while the other region may be mesh-divided in low density. In this case, the precision of analysis result is high in the high-density mesh divided region. However, it is impossible to obtain a high precision analysis result in the entire model data.

The result of analysis performed as above is observed by for example a designer who designed the model data. Hereinafter, the user who observes the analysis result will be referred to as an "observation user". As the observation user checks only the analysis result, the observation user cannot check the analysis condition as a precondition of the analysis.

However, to perform a test with certainty, it is necessary for the observation user to check the setting status of the analysis condition which has a large influence on the precision of analysis result. More particularly, when the above-described mesh division density is used as an analysis condition, it is desirable that the observation user can check the positions of the high-density mesh-divided region and the low-density mesh-divided region in the analysis object before the user perform the test.

Further, to perform a test with higher certainty, it is also necessary for the observation user to check the entire index calculated comprehensively using all the analysis conditions, since only one analysis condition is not directly related to the precision of analysis result. For example, even in a high-density mesh-divided region, when settings of other analysis conditions are poor, the precision of analysis result in the region may be low. In the present specification, an index comprehensively calculated from all the analysis conditions used in an analysis simulation is defined as a degree of reliability. The observation user uses the degree of reliability as an index representing the precision of analysis result, thereby performs a test with higher certainty from the result of analysis simulation. Further, the observation user checks the settings of the respective analysis conditions, thereby grasps factor(s) which degrades the precision of analysis result.

However, in a general procedure of present analysis simulation, first, various analysis conditions are set by a preprocessor, then an analysis simulation is performed by an analysis simulation unit, and the analysis result is visualized by a post processor. Accordingly, the analysis user checks the analysis conditions and the degree of reliability back in the phase of the preprocessor. However, the time utility of such checking is low and the observation user cannot easily check the analysis conditions and the degree of reliability in the phase of test of the analysis result. Although a system in which the entire precision of the analysis result can be checked as a numerical value has been proposed, such numeric representation is not intuitive, and often cannot be understood by some observation user who is not an analysis expert. Further, with only the entire precision, the observation user cannot perform tests from various points such as respective regions and respective analysis conditions. That is, with the present techniques, it is difficult for the observation user to easily or intuitively check the precision of the analysis result.

SUMMARY OF THE INVENTION

According to an aspect of the present invention, an analyzation apparatus and its control method to, in display in an analysis simulation, enable an observation user to intuitively grasp the precision of an analysis result, are provided.

According to one aspect of the present invention, there is provided a control method for an analyzation apparatus to perform an analysis simulation in accordance with analysis condition data, comprising:

a generation step of generating analysis condition model data by assigning an analysis condition to each region of a three-dimensional model represented with analysis object model data of the analysis simulation based on analysis condition data set for the analysis simulation; and a display step of displaying the tree-dimensional model represented with the analysis condition model data.

According to another aspect of the present invention, there is provided a control method for an analyzation apparatus to perform an analysis simulation in accordance with analysis condition data, comprising:

an analyzation step of performing the analysis simulation in accordance with the analysis condition data and generating analysis result data representing an analysis result three-dimensional model;

a generation step of generating analysis condition model data by assigning an analysis condition to each region of a three-dimensional model represented with the analysis result data based on the analysis condition data set for the analysis simulation; and a display step of displaying the tree-dimensional model represented with the analysis condition model data.

Also, according to one aspect of the present invention, there is provided an analyzation apparatus which performs an analysis simulation in accordance with analysis condition data, comprising:

a generation unit configured to generate analysis condition model data by assigning an analysis condition to each region of a three-dimensional model represented with analysis object model data of the analysis simulation based on analysis condition data set for the analysis simulation; and a display unit configured to display the tree-dimensional model represented with the analysis condition model data.

Furthermore, according to one aspect of the present invention, there is provided an analyzation apparatus which performs an analysis simulation in accordance with analysis condition data, comprising:

an analyzation unit configured to perform the analysis simulation in accordance with the analysis condition data and generating analysis result data representing an analysis result three-dimensional model;

a generation unit configured to generate analysis condition model data by assigning an analysis condition to each region of a three-dimensional model represented with the analysis result data based on the analysis condition data set for the analysis simulation; and a display unit configured to display the tree-dimensional model represented with the analysis condition model data.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

First Embodiment

In a first embodiment, an example of presentation of analysis condition model data of an arbitrary structure in virtual reality space (Hereinbelow, VR (Virtual Reality) space) on a flat display will be described.

Figure 1:
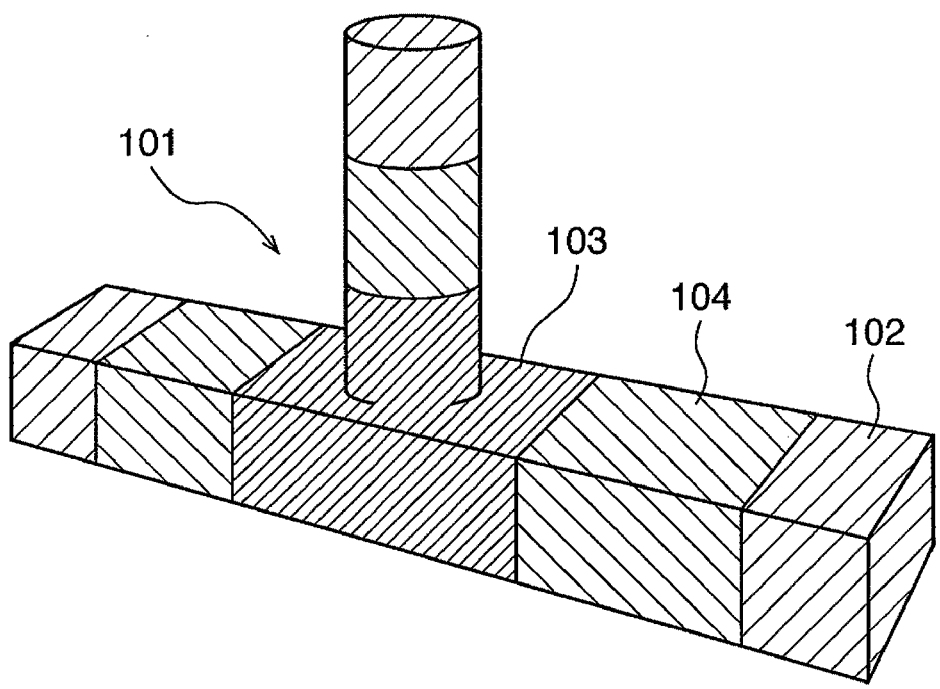
FIG. 1 is a display example of an analysis condition model according to a first embodiment.

FIG. 1 shows an example of a display image of analysis condition model data presented to an observation user. In FIG. 1, reference numeral 101 denotes a three-dimensionally visualized analysis condition model based on analysis condition model data. In regions 102 to 104, the settings of analysis condition are different. The example of FIG. 1 shows a display of the result of rendering of the analysis condition model 101. Hereinbelow, the outline of the present embodiment will be described using FIG. 1.

The analysis condition model 101 is obtained by rendering analysis condition model data generated from analysis condition data in some stress analysis. In this example, the analysis condition data indicates a mesh division density. As described above, the elaborateness of mesh division density influences the precision of analysis result. The analysis condition model 101 is rendered such that the chroma is changed by region in accordance with difference in mesh division density. The region 102, in which the mesh of division is the roughest, is rendered with the lowest chroma. The region 103, in which the mesh of division is the finest, is rendered with the highest chroma. The region 104, in which an intermediate mesh division density between that of the region 102 and that of the region 103 is set, is rendered with chroma intermediate between that of the region 102 and that of the region 103. Thus, the analysis condition model 101 is representation of chroma distribution of the analysis condition data on the analysis object model.

In the example of FIG. 1, the observation user can intuitively check the mesh division density of the stress analysis in each region by checking the chroma distribution of the analysis condition model 101. Accordingly, the observation user observes the analysis condition model data, thereby easily checking the analysis condition set by the analysis user.

Figure 2:
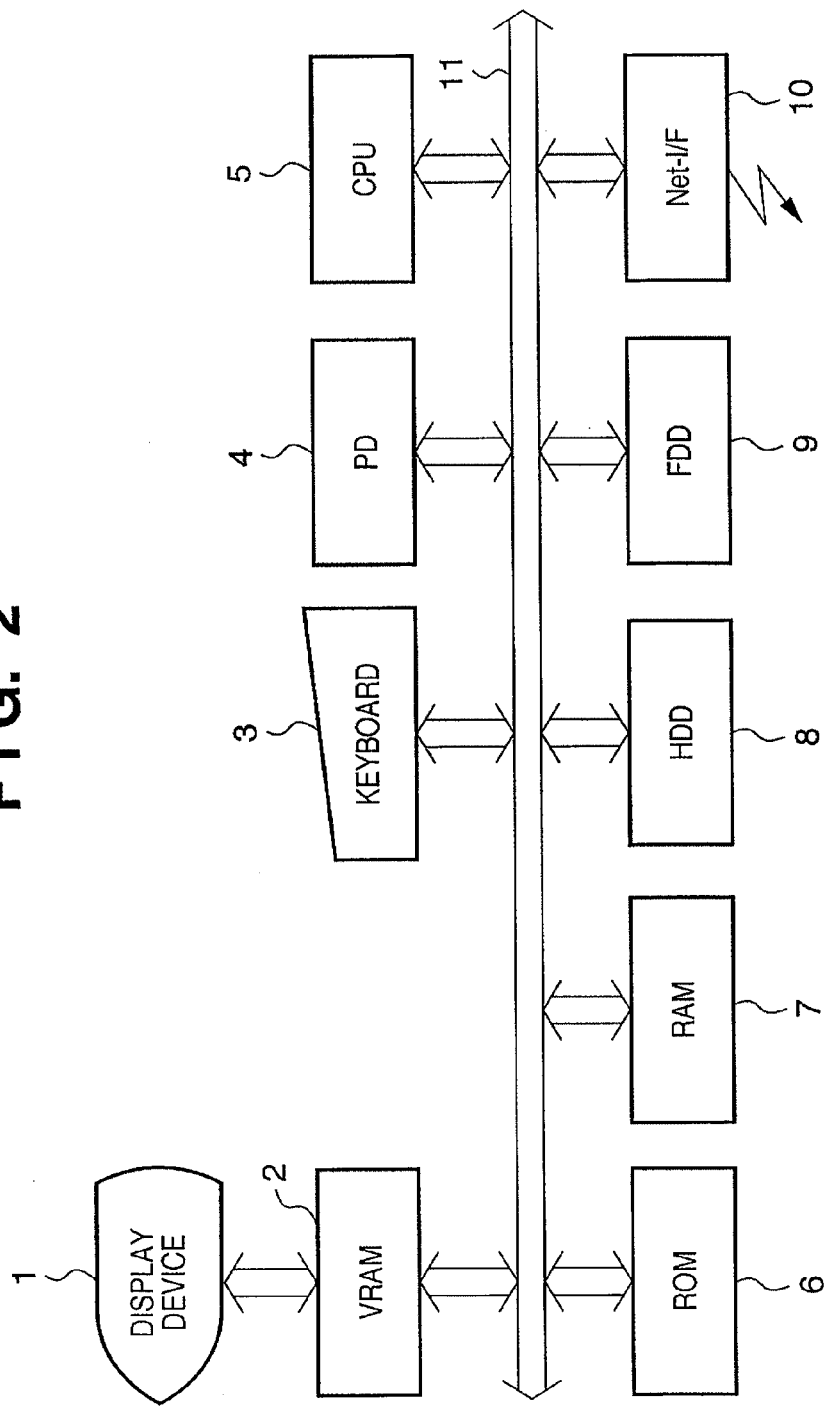
FIG. 2 is a block diagram showing an example of a hardware configuration of an information processing apparatus according to the first embodiment.

FIG. 2 is a block diagram showing an example of a configuration of an information processing apparatus according to the present invention. In FIG. 2, numeral 1 denotes a display device to display information on data processed by an application program, various message menus and the like; 2, a video RAM (VRAM) to map an image displayed on the screen of the display device 1; 3 and 4, a keyboard and a pointing device used for input of characters and the like in predetermined fields on the screen and indicating icons, buttons and the like in GUI; and 5, a CPU to control the entire apparatus.

Numeral 6 denotes a ROM holding an operation processing procedure (program) for the CPU 5. Note that the ROM 6 further holds application program and error processing program related to data processing, and a program related to a flowchart to be described later. Numeral 7 denotes a RAM used as a work area for execution of the above-described various programs by the CPU 5 and a temporary saving area upon error processing. The various processings to be described later with reference to the flowcharts are realized by execution of a control program stored in the ROM 6 by the CPU 5. Otherwise, the various processings may be realized by loading a necessary program from an HDD 8 or FDD 9 to the RAM 7 and executing the program by the CPU 5.

Numeral 8 denotes a hard disk drive (HDD); and 9, a floppy (registered trademark) disk drive (FDD). The respective disks are used for storage and reading of application programs, data, libraries and the like. Further, in place of or in addition to the FDD, an optical (magnetic) disk drive for a CD-ROM, an MO, a DVD or the like, or a magnetic tape drive for a tape streamer, a DDS or the like, may be provided.

Numeral 10 denotes a network interface for connecting the apparatus to a network; and 11, an I/O bus (including an address bus, a data bus and a control bus) for interconnection of the above-described respective units.

Figure 3:
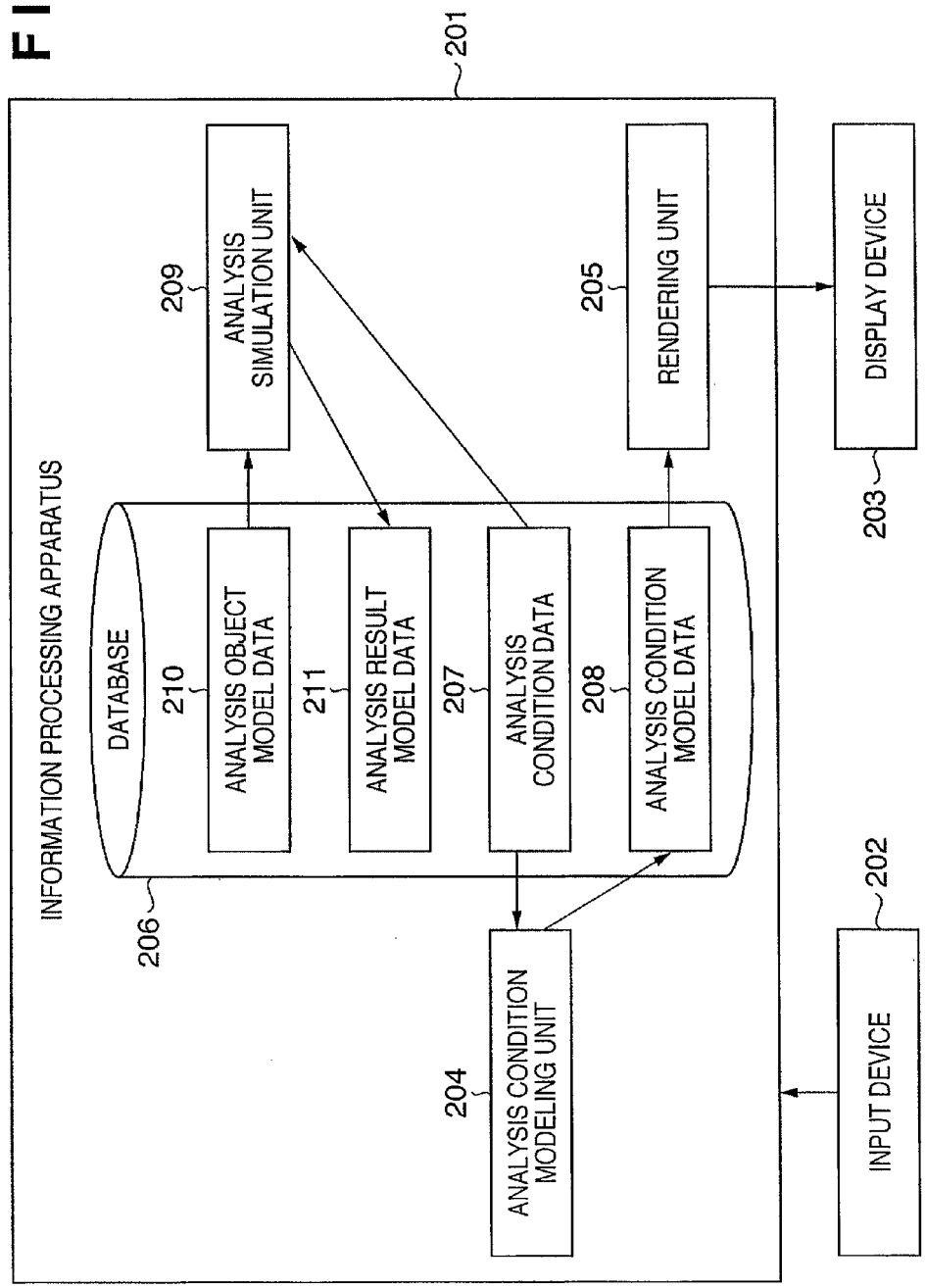
FIG. 3 is a block diagram showing an example of a functional configuration to display the analysis condition model according to the first embodiment.

Next, the functional configuration of the information processing apparatus according to the first embodiment to display the analysis condition model 101 will be described with reference to FIG. 3. FIG. 3 is a block diagram showing an example of the functional configuration of an analysis condition data display system to realize a function of three-dimensionally representing analysis condition data using chroma or the like and displaying the analysis condition data on the display device 203. The analysis condition data display system has an information processing apparatus 201 to render modeling data for analysis condition data, an input device 202 to input a command to the information processing apparatus 201, and a display device 203 to display the model data rendered by the information processing apparatus 201. Note that the information processing apparatus 201 functions as an analyzation apparatus to perform an analysis simulation in accordance with analysis condition data. The input device 202 corresponds to the keyboard 3 and the pointing device 4 in FIG. 2, and the display device 203, to the display device 1 in FIG. 2.

Herein below, the respective constituent elements of the system shown in FIG. 3 will be described. In the information processing apparatus 201, a database 206 holds analysis condition data 207, analysis condition model data 208, analysis object model data 210, and analysis result model data 211.

When the analysis condition data 207 stored in the database 206 is inputted, an analysis condition modeling unit 204 performs calculation of three-dimensional modeling using the obtained analysis condition data 207, thereby obtains a three-dimensional model of the analysis condition data. That is, the analysis condition modeling unit 204 generates the three-dimensional model data by assigning an analysis condition to each region of a three-dimensional model represented with the analysis object model data 210 of the analysis simulation, based on the analysis condition data set for the analysis simulation. The obtained three-dimensional model data representing the analysis condition is stored, as the analysis condition model data 208, into the database 206. A rendering unit 205 obtains the analysis condition model data 208 from the database 206, renders a three-dimensional model represented with the analysis condition model data, and displays the rendered three-dimensional model data on the display device 203. Further, the rendering unit 205 displays the analysis result model data 211 on the display device 203. An analysis simulation unit 209 performs the analysis simulation based on the analysis object model data 210 and the analysis condition data 207, and obtains the analysis result model data 211. The analysis result model data 211 is stored into the database 206.

The input device 202 has a keyboard, a mouse, a touch panel and the like. The input device 202 is used for input of commands or data for modeling processing, model data display processing, interactive operations with respect to model data, and the like. The display device 203 is a flat display, an HMD (Head Mount Display), a 3D display or the like. The display device 203 produces a display of model data rendered by the rendering unit 205 and the result of processing by the input device 202.

Note that the analysis condition modeling unit 204, the rendering unit 205 and the analysis simulation unit 209 are realized by execution of the control program stored in the ROM 6 or the RAM 7 by the CPU 5. Further, the database 206 is stored on e.g. the HDD 8.

Figure 4:
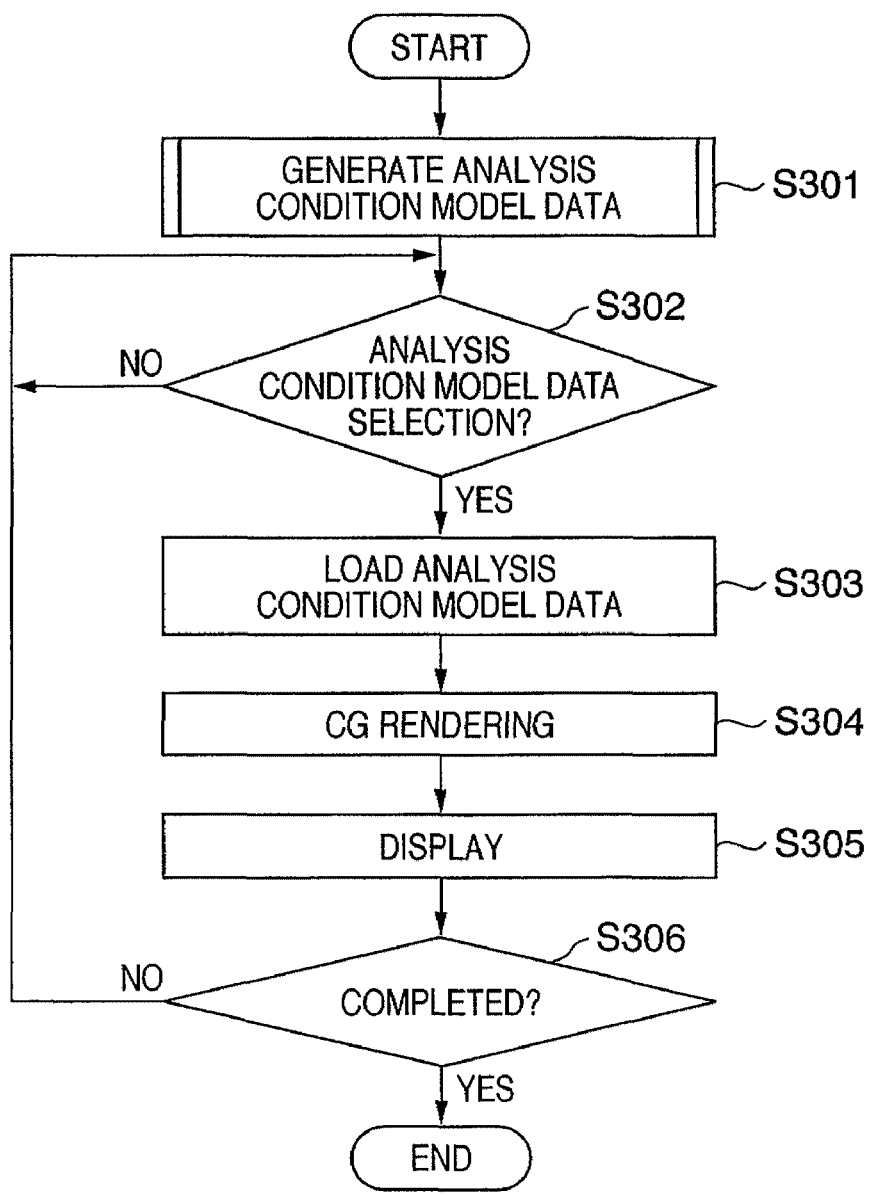
FIG. 4 is a flowchart showing analysis condition model display processing according to the first embodiment.

Next, processing in the information processing apparatus 201 according to the first embodiment will be described with reference to the flowchart of FIG. 4.

First, at step S301, the analysis condition modeling unit 204 generates the analysis condition model data 208, and stores the analysis condition model data 208 into the database 206. The generation of analysis condition model data at step S301 will be described later. Next, at step S302, the CPU 5 determines whether or not a selection input to read the analysis condition model data 208 from the input device 202 to the rendering unit 205 has been made. If it is determined that a selection input has been made, the process proceeds to step S303, otherwise, repeats step S302 and waits for the user's selection input.

That is, as described later, the analysis condition modeling unit 204 generates plural types of analysis condition model data in correspondence with plural types of analysis condition data, and stores them into the database 206 as a storage unit. At step S302, these plural types of analysis model data are list-displayed on the display device 203, and one of them is selected (designated) by the user. At step S303, in accordance with the user's operation to designate one of the plural types of analysis condition model data, the designated analysis condition model data is provided to the rendering unit 205.

When it is determined at step S302 that a selection input has been made, then at step S303, the rendering unit 205 reads the analysis condition model data 208 selected at step S302 from the database 206. Note that the read data includes model shape data, arrangement data indicating the position and attitude in the world coordinate system, and model attribute data. Accordingly, the rendering unit 205 can display the analysis condition model based on the analysis condition model data in position and orientation designated in real space.

At step S304, the rendering unit 205 generates an object such as the analysis condition model data 208 read at step S303, as an image viewed from an observation user's viewpoint. At step S305, the rendering unit 205 displays the image generated at step S304 on the display device 203.

Finally, at step S306, the information processing apparatus 201 determines whether or not a processing termination instruction has been issued from the user. If it is determined that a termination instruction has been issued, the process ends. On the other hand, if it is determined that no termination instruction has been issued, the process returns to step S302, to repeat the processing at steps S302 to S306.

Figure 5:
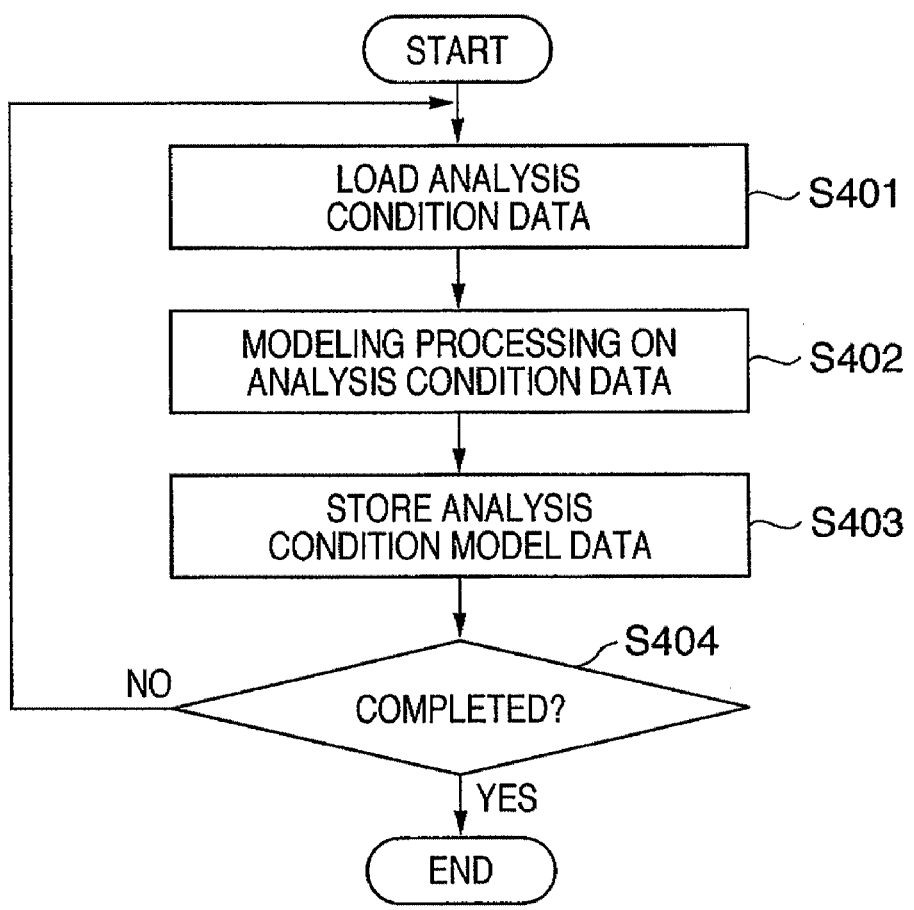
FIG. 5 is a flowchart showing analysis condition model data generation processing according to the first embodiment.

Next, the analysis condition model data generation processing at step S301 will be described in detail with reference to FIG. 5. FIG. 5 is a flowchart showing the processing to generate the analysis condition model data 208 using the analysis condition data 207 in the database 206.

First, at step S401, the analysis condition modeling unit 204 reads the analysis condition data 207 from the database 206. In the present embodiment, the analysis condition data is the mesh division density, however, the analysis condition data is not limited to this data. As analysis condition data, model shape data, the mesh division density, a mechanical characteristic, a physical characteristic, a chemical characteristic, temperature distribution, shape difference between model data and mesh data, an analysis boundary condition and the like, set upon execution of analysis simulation, are available. Accordingly, at step S401, it may be arranged such that the observation user selects one of plural items of the analysis condition data 207 and the selected item is read.

At step S402, the analysis condition modeling unit 204 performs modeling on the analysis condition data as three-dimensional model data thereby generates the analysis condition model data 208. More particularly, the analysis condition modeling unit 204 performs modeling on the analysis object model data 210 while changing the chroma by region in accordance with difference in analysis condition data.

The analysis condition data is set for each region of the analysis object model. That is, the analysis condition modeling unit 204 generates the analysis condition model data 208 based on the analysis object model data 210 and the analysis condition data 207. For example, when the analysis condition data is the mesh division density, the mesh division density is set for each region of the analysis object model. In the analysis object model, a region of interest for the observation user, i.e., a region in which the analysis simulation is to be performed with high precision, is high-density mesh-divided by the analysis user. On the other hand, a region which is not a region of interest for the observation user, i.e., a region in which high precision analysis simulation is not to be performed, is low-density mesh-divided by the analysis user. Based on the above analysis condition data 207 and the analysis object model data 210, the analysis condition modeling unit 204 performs modeling while rendering a high-chroma color on the region where the high-density mesh division is set, and rendering a low-chroma color on the region where the low-density mesh division is set. Thus the analysis condition model data 208 is generated.

Note that in the above example, the modeling is performed while the chroma is changed by region in accordance with difference in analysis condition data, however, the modeling is not limited to the above modeling. Any modeling may be performed as long as the difference in analysis condition can be expressed. For example, modeling may be performed while not chroma but color or transparency is changed. Note that modeling while changing transparency will be described later.

Next, at step S403, the analysis condition modeling unit 204 registers the analysis condition model data 208 generated at step S402 into the database 206. The format of the registered data includes model shape data, arrangement data of position and attitude in the world coordinate system, and model attribute data.

Then at step S404, the analysis condition modeling unit 204 determines whether or not a processing termination instruction has been issued from the user. If it is determined that a termination instruction has been issued, the analysis condition model data generation processing shown in FIG. 5 is terminated. On the other hand, if it is determined that no termination instruction has been issued, the process returns to step S401 to repeat the processing at steps S401 to S404, thereby plural types of analysis condition model data corresponding to plural types of analysis conditions are generated.

As described above, the analyzation apparatus realized with the information processing apparatus according to the present embodiment can generate and display the analysis condition model data 208 representing the difference in analysis condition with difference in transparency. For example, in the analysis condition model 101 shown in FIG. 1, modeling can be performed such that the transparency in the regions 102 to 104 with different analysis condition data is changed in correspondence with analysis condition.

Next, an example using, as analysis condition model data, mesh division density in stress analysis will be described. As described above, the elaborateness of mesh division density influences the precision of analysis result. Accordingly, the analysis condition model 101 is rendered while the transparency is changed in accordance with difference in mesh division density. The region 102, in which the mesh division density is the lowest, is rendered with the highest transparency. Further, the region 104, in which the mesh division density is higher than that in the region 102, is rendered with transparency lower than that of the degree of reliability model data in the region 102. Further, the region 103, in which the mesh division density is equal to or higher than a certain degree, is rendered with transparency "0". As described above, the analysis condition model 101 is representation of analysis condition data with transparency.

According to the above example, the observation user can check the mesh division density of stress analysis in each region by checking the transparency in each region of the analysis condition model 101. In this manner, the observation user observes the analysis condition model 101, thereby checks the analysis condition data set by the analysis user.

Note that at step S402, the analysis condition model data using transparency is generated by modeling by the analysis condition modeling unit 204 while changing transparency in correspondence with analysis condition by region of analysis object model. That is, in a region where the analysis condition is set so as to perform the analysis simulation with high precision, modeling is performed with low transparency, while in a region where the analysis condition is set so as to perform the analysis simulation with low precision, modeling is performed with high transparency, thereby the analysis condition model data 208 is generated.

Further, it may be arranged such that the user selects desired one of presentation using color, presentation using chroma and presentation using transparency.

As described above, according to the analysis condition model data display method according to the first embodiment, the analysis condition data can be displayed as three-dimensional chroma distribution, color distribution or transparency distribution. That is, in an analysis object model, the set analysis condition can be intuitively grasped. Accordingly, it is not necessary for the observation user to check the analysis condition data back in the phase of analysis simulation execution phase by the analysis user. The observation user can easily check the analysis condition data.

Further, since it is assured that the observation user can easily check the analysis condition data in the analysis result test phase, the analysis user can more freely set the precision in analysis simulation. That is, even when a region where the analysis simulation is performed with high precision and a region where the analysis simulation is not performed with high precision are set, the observation user can check the precision of analysis result in an observed region. Accordingly, erroneous recognition of analysis result can be reduced.

Second Embodiment

In the first embodiment, the analysis condition data is represented with the entire analysis condition model data and is displayed on the display device 203, however, the present invention is not limited to this arrangement. In the second embodiment, the analysis condition data is displayed only regarding a region where the analysis condition data is required. Note that in the second embodiment, the analysis condition model data of an arbitrary structure in VR space is presented on a flat display as in the case of the first embodiment.

Figure 6:
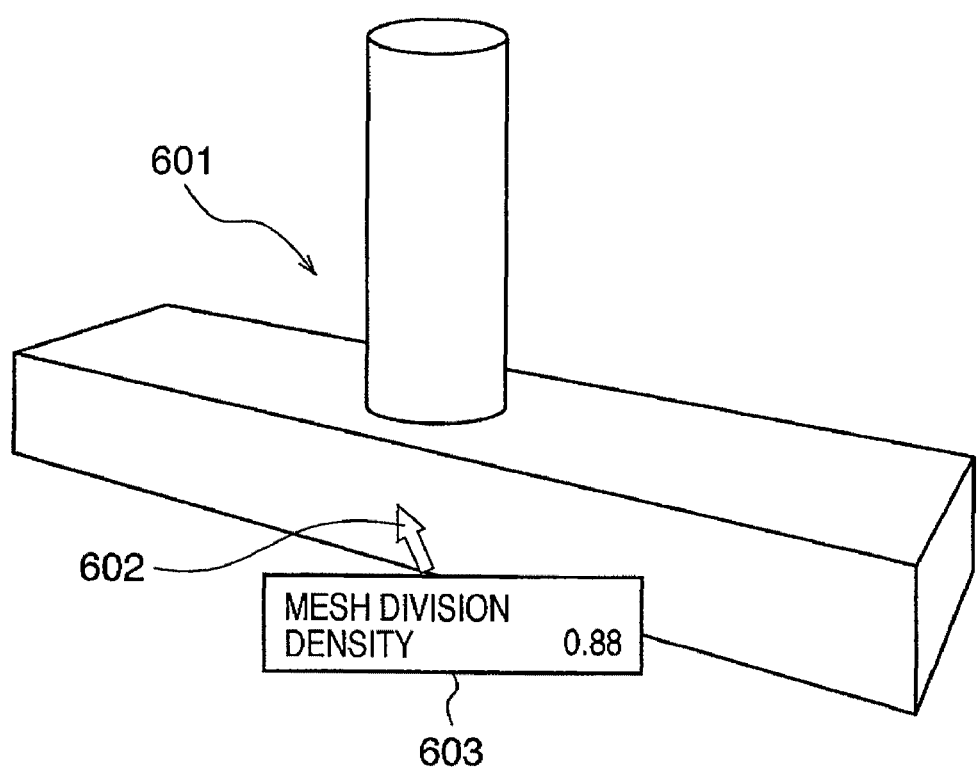
FIG. 6 is a display example of the analysis condition model according to a second embodiment.

FIG. 6 is a display example of the analysis condition model according to the second embodiment presented to the observation user. As described above, the analysis condition model in FIG. 6 is the result of rendering of the analysis condition model data 208 in the database 206 by the rendering unit 205, displayed on the display device 203. Next, the outline of the second embodiment will be described using FIG. 6.

Various methods may be used for display of analysis condition data regarding a part of analysis condition model. In the present embodiment, a part of analysis condition data is displayed with annotations. In FIG. 6, numeral 601 denotes an analysis condition model displayed in accordance with the analysis condition model data 208; 602, a cursor; and 603, an annotation.

The analysis condition model 601 is generated from analysis condition data in some stress analysis. In the present example, the analysis condition data is mesh division density. As shown in FIG. 6, when an arbitrary position (region) of the analysis condition model 601 is designated with the cursor 602, the mesh division density of the designated position (region) is displayed as the annotation 603. That is, the analysis condition model 601 represents the mesh division density in only the position (region) designated with the input device 202. For example, when the analysis condition model has regions 102 to 104 as shown in FIG. 1, the display of the annotation 603 is determined based on the region designated with the cursor 602. In this example, the observation user can check the mesh division density of stress analysis in a designated region by observing the annotation 603.

Note that in this example, the analysis condition in a designated region is displayed with an annotation, however, the present invention is not limited to this arrangement. For example, it may be arranged such that the region where the analysis condition indicated with the annotation 603 is displayed recognizably for the user by changing the color, chroma, transparency or the like of the region designated with the cursor 602. Further, when the color, chroma, transparency or the like of the designated region is changed, colors, chroma, transparency or the like previously assigned based on analysis condition may be used. In this case, as the analysis condition can be recognized from the color, chroma, transparency or the like of the designated region, the annotation 603 may be omitted. That is, the analysis condition in only a region designated with the input device 202 can be represented with a color, chroma, transparency or the like.

As described above, according to the second embodiment, the rendering unit 205 detects a region designated by the user using the input device 202 in a three-dimensional model displayed on the display device 203, and displays the analysis condition assigned to the detected region with an annotation or the like. Accordingly, the observation user designates a desired position (region) of analysis condition model data, thereby can check the analysis condition data set in the position designated by the analysis user.

Note that the display of analysis result model based on the analysis result model data 211 is realized by a well-known method. Note that the analysis result model may be displayed together with the above-described analysis condition model. For example, the analysis result model may be displayed around the display of the analysis result model.

Third Embodiment

In the first and second embodiments, the analysis condition model data represents only analysis condition data, however, the present invention is not limited to this arrangement. In the third embodiment, the analysis condition data and the analysis result data are represented in an analysis condition model. That is, in the third embodiment, the analysis result, combined with the analysis condition data, is represented as analysis condition model data, thereby the analysis condition data, together with the analysis result, can be presented to the observation user. Note that in the third embodiment, the analysis result combined with the analysis condition data is defined as analysis condition model data, however, the analysis result model data 211 may be combined with the analysis condition as a three-dimensional model. According to the third embodiment, the analysis condition modeling unit 204 generates the analysis condition model data 208 using the analysis result model data 211 and the analysis condition data 207. For example, the analysis condition represented with the analysis condition data 207 is assigned to each region of the analysis result three-dimensional model, thereby the analysis condition model data 208 is generated and displayed.

Figure 7:
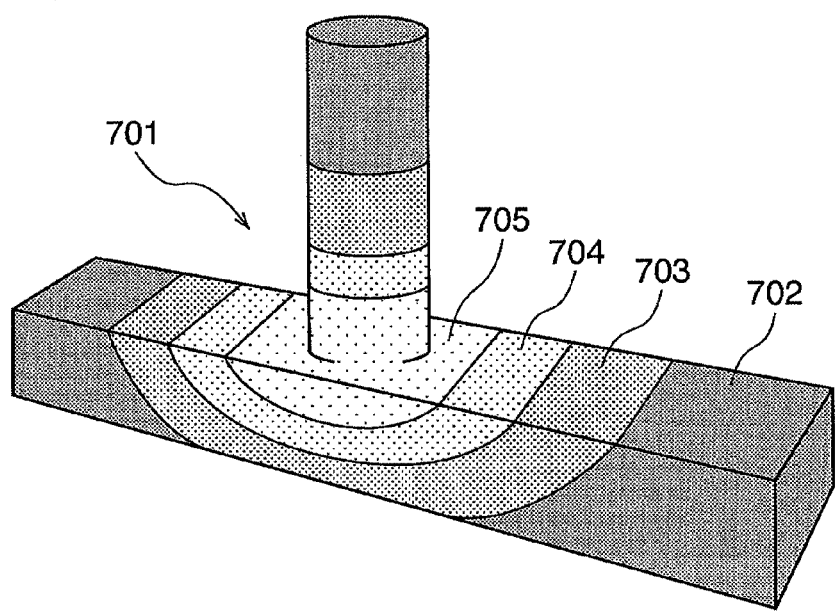
FIG. 7 is a display example of a stress analysis result model.

Prior to the description of the third embodiment, an example where the analysis result of an arbitrary structure in VR space is presented on a flat display will be described. As described above, the analysis simulation unit 209 performs an analysis simulation in accordance with the analysis condition data 207, and generates the analysis result model data 211 representing an analysis result three-dimensional model. FIG. 7 shows, as a display example of a stress analysis result model, an analysis result model 701 rendered by the rendering unit 205 based on the analysis result model data 211 generated by the analysis simulation unit 209. The analysis result model 701 represents the result of stress analysis, and regions 702 to 705 are regions with respectively different analysis result values.

The analysis result model 701, in which the stress distribution is represented in color, is rendered in color. The region 702, under the lowest stress, is rendered in e.g. blue. The region 703, which is the third stressed region, is rendered in e.g. green. The region 704, which is the second stressed region, is rendered in e.g. yellow. The region 705, under the highest stress, is rendered in e.g. red. The analysis condition data is added to the analysis result model 701, and the analysis condition model data 208 is generated.

In the third embodiment, the analysis condition model data of an arbitrary structure in VR space is presented on a flat display as in the case of the first embodiment.

Figure 8:
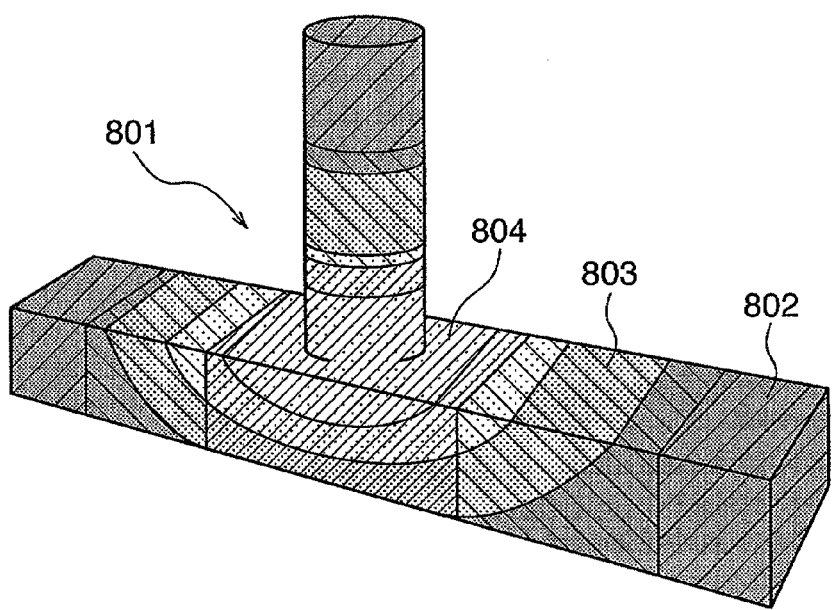
FIG. 8 is a display example of the analysis condition model according to a third embodiment.

FIG. 8 is an example of an image presented to the observation user. In this example, the result of rendering of the analysis condition model data 208 in the database 206 by the rendering unit 205 is displayed on the display device 203. Next, the outline of the third embodiment will be described using FIG. 8.

The example of FIG. 8 shows the result of stress analysis combined with analysis condition data. In FIG. 8, an analysis condition model 801 is obtained by combining the analysis result model 701 in FIG. 7 as a stress analysis result with the analysis condition model 101 in FIG. 1 representing the analysis condition with transparency distribution. In regions 802 to 804, the analysis results and analysis condition data are different. The analysis condition model 801 is generated from the analysis result and the analysis condition data in some stress analysis. In this example, the analysis condition data is mesh division density.

In the analysis condition model 801, the stress distribution as the analysis result is represented and rendered in color, and further, the analysis result is rendered while the transparency is changed by region in accordance with difference in mesh division density. For example, the region 802 is an AND region between the region 702 under the lowest stress and the region 102 with the lowest mesh division density. Accordingly, the region 802 is displayed in a combined color between the blue in the region 702 and the high transparency in the region 102 (i.e., blue having high transparency). Similarly, the region 803 is an AND region between the third stressed region 703 and the region 104 with a mesh division density higher than that in the region 102. Accordingly, the region 803 is displayed in a combined color between the green in the region 703 and the transparency lower than that in the region 102. The region 804 is an AND region between the region 705 under the highest stress and the region 103 with the highest mesh division density. Accordingly, the region 804 is displayed in a combined color between the red in the region 705 and the transparency in the region 103 (=0) (in this case, the red in the region 705).

As described above, in the analysis condition model 801 according to the third embodiment, the stress is represented with color distribution and the analysis condition data is represented with transparency distribution. Accordingly, in the present embodiment, the observation user can recognize the stress distribution from the analysis condition model 801, and can check the mesh division density in each region from the transparency of the analysis condition model 801. That is, the observation user observes the analysis condition model data, thereby checks the analysis condition data set by the analysis user, and further, recognizes the analysis result using the analysis condition data. According to the third embodiment, the observation user can check the mesh division density in the stress analysis in each region by observing the transparency of the analysis condition model 801, and can check the result of stress analysis by observing the color distribution.

Next, the flow of processing in the third embodiment will be described. The processing is the same as that in the first embodiment except the generation of the analysis condition model data 208. In the first embodiment, at step S402, the analysis condition modeling unit 204 performs modeling on the analysis object model data 210 while changing chroma or transparency by region in accordance with difference in analysis condition data, thereby generates the analysis object model data 208. On the other hand, the analysis condition modeling unit 204 in the third embodiment assigns the analysis condition to each region of a three-dimensional model represented with the analysis result model data 211 based on the analysis condition data 207 set for the analysis simulation thereby generates the analysis condition model data 208. In this example, the analysis condition modeling unit 204 performs modeling on the analysis result model data 211 while changing the transparency by region in accordance with difference in analysis condition data thereby generates the analysis condition model data 208. In other words, the analysis condition modeling unit 204 generates the analysis condition model data by assigning transparency corresponding to analysis condition to each region and changing the transparency of colors representing the analysis result. That is, the analysis condition modeling unit 204 generates the analysis condition model data 208 by performing modeling the analysis result model data with, (1) in a region where the analysis condition is set so as to perform the analysis simulation with high precision, the transparency set to "0" or a low level, and
(2) in a region where the analysis condition is set so as to perform the analysis simulation with low precision, the transparency set to a high level.

Note that the display format using annotations as described in the second embodiment may be employed. That is, the rendering unit 205 detects a region designated by the user in the analysis result three-dimensional model displayed on the display device 203, and displays the analysis condition assigned to the detected region. For example, when an arbitrary position of the analysis result three-dimensional model displayed on the display device 203 is designated with a cursor, the analysis condition is displayed as an annotation.

As described above, in the third embodiment, as the observation user observes the analysis condition model 801, thereby simultaneously observes the analysis result and the analysis condition data. Accordingly, in the third embodiment, a more intuitive test with higher precision in comparison with conventional art can be realized.

Fourth Embodiment

In the first to third embodiments, only the analysis condition model based on the analysis object model data 210 is displayed on the display device 203, however, the present invention is not limited to this arrangement. For example, an analysis condition model based on the analysis condition model data 208 may be displayed in an analysis result model based on the analysis result model data 211 or its surrounding three-dimensional space. At this time, the analysis condition model data is arranged in the same position and the same attitude as those of the analysis object model data in the world coordinate system. Accordingly, the observation user can observe the analysis object model, the analysis result model corresponding to the analysis object model, and further, the analysis condition model. In the fourth embodiment, the analysis condition model data is generated and displayed by assigning the analysis condition represented with analysis condition data to each region of a tree-dimensional model (three-dimensional space) of the analysis result represented with the analysis result model data.

Figure 9:
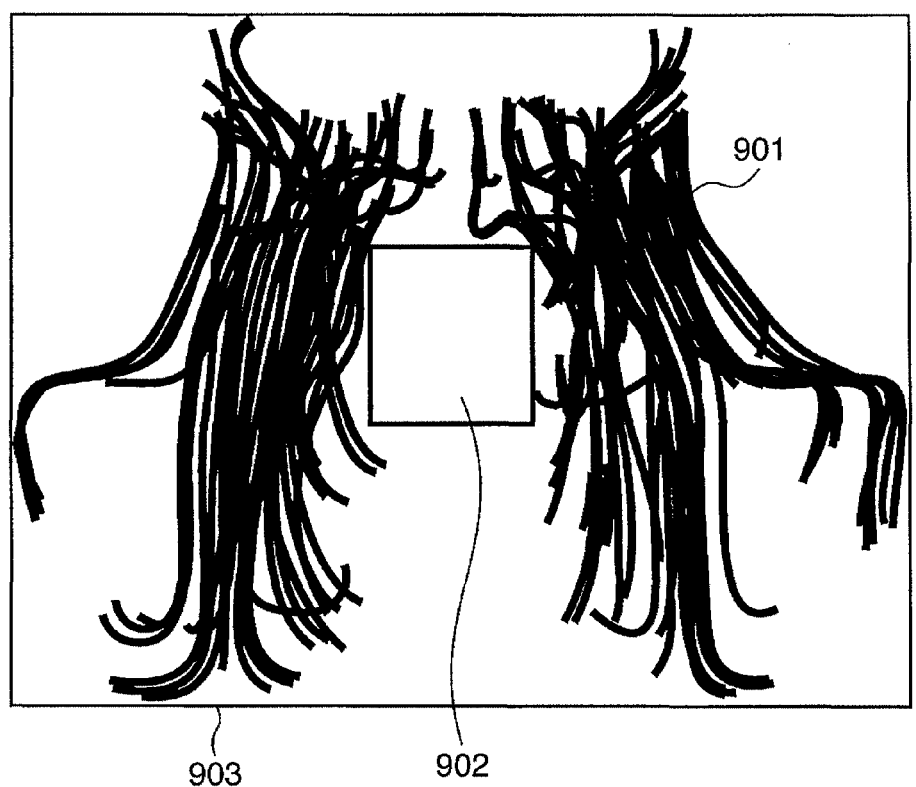
FIG. 9 is a display example of a fluid analysis result model.

Prior to the description of the fourth embodiment, an example where an analysis result of an arbitrary structure in VR space is presented on a flat display will be described. FIG. 9 is a display example of a fluid analysis result. In this example, numeral 901 denotes an analysis result model representing the result of fluid analysis; 902, an analysis object model representing a fluid analysis object model; and 903, a boundary set upon execution of analysis simulation.

In the example of FIG. 9, the analysis result model 901 and the analysis object model 902 are rendered by the rendering unit 205. The fluid (analysis result model 901) with respect to the analysis object model 902 is represented as a band object. The analysis result model 901 represents the result of analysis of the change of flow direction of airflow from the upper side to the lower side of the screen by collision against the analysis object model 902. The analysis condition data is added to the analysis result model 901 and the analysis condition model data 208 is generated.

Figure 10:
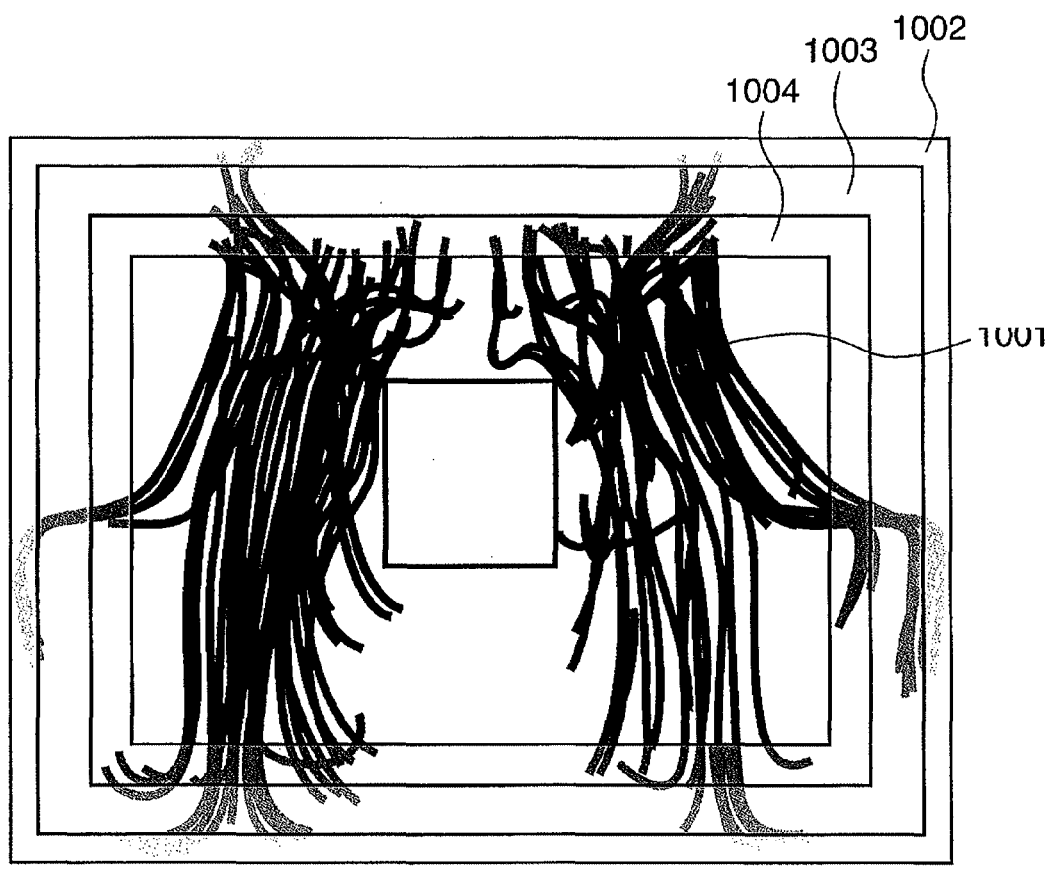
FIG. 10 is a display example of the fluid analysis result model according to a fourth embodiment.

FIG. 10 shows an example of an image presented to the observation user. In this example, the result of rendering of the analysis condition model data 208 stored in the database 206 is displayed on the display device 203. Hereinbelow, the outline of the present embodiment will be described using FIG. 10.

The example of FIG. 10 shows the result of fluid analysis combined with the analysis condition data 207. Numeral 1001 denotes analysis condition model data generated by adding the analysis condition data to the analysis result model 901 in FIG. 9 as a fluid analysis result. In regions 1002 to 1004, the analysis condition data are different. That is, the analysis result three-dimensional model in the fourth embodiment includes an analysis result object (analysis result model 901) and its surrounding three-dimensional space. The analysis condition modeling unit 204 in the fourth embodiment assigns the analysis condition to each region in such three-dimensional space.

The example of FIG. 10 shows a case where the analysis condition data is an analysis boundary condition, and rendering is performed while the transparency of the analysis condition model 1001 is changed in correspondence with difference in distance from the boundary 903. The analysis boundary condition means the boundary 903 in three-dimensional space upon designation of a range in the three-dimensional space for execution of an analysis simulation. Hereinafter, the analysis boundary condition will be referred to as an "analysis boundary".

The analysis boundary influences the precision of analysis result. More particularly, as the analysis is performed closer to the boundary 903, the result of analysis is influenced by the boundary 903. In the example of FIG. 10, around the analysis boundary, the airflow is changed although there is no negative effect. In this example, the analysis processor erroneously recognizes the analysis boundary as a negative effect upon analysis simulation. That is, the precision of analysis result near the analysis boundary is lowered by the influence of the analysis boundary.

Accordingly, when the analysis condition data is an analysis boundary condition, the difference in distance from the analysis boundary is three-dimensionally represented and presented to the observation user. More particularly, the transparency of the analysis condition model 1001 is changed in correspondence with distance from the analysis boundary.

As the region 1002 is the closest to the analysis boundary, the analysis result in the region 1002 is much influenced by the boundary condition. That is, the precision of the analysis result is low. Accordingly, the analysis condition model 1001 in the region 1002 is rendered with the highest transparency. Further, the region 1003 is farther than the region 1002 from the analysis boundary and less influenced by the boundary condition in comparison with the region 1002. Accordingly, the analysis condition model 1001 in the region 1003 is rendered with transparency lower than that in the region 1002. As the region 1004 is away from the analysis boundary by some distance, the region 104 is almost not influenced by the analysis boundary. The analysis condition model 1001 in the region 1004 is rendered with "0" transparency. In this manner, the analysis condition model 1001 is displayed while the transparency is changed in correspondence with distance from the analysis boundary. The analysis condition model 1001 in a region away from the analysis boundary by some distance is rendered with "0" transparency since the region is not influenced by the boundary. In this manner, the analysis condition model 1001 represents the distance from the analysis boundary, and represents the fluid analysis result with the band object. As described above, the analysis condition modeling unit 204 in the fourth embodiment generates analysis condition model data by assigning transparency corresponding to the analysis condition to each region in the three-dimensional space and changing the transparency of a color representing the analysis result object.

Note that the processing according to the fourth embodiment is almost the same as that according to the first embodiment. Note that in the first embodiment, the data selected and read at steps S302 and S303 is the analysis condition model data, however, in the fourth embodiment, the analysis result model data 211 in addition to the analysis condition model data 208 is selected and read.

As described above, according to the fourth embodiment, the observation user can the distance between the position of execution of the fluid analysis and the analysis boundary as the analysis condition, by observing the transparency of the analysis condition model 1001. Further, in the fourth embodiment, the analysis object model 902 and the band object as a result of fluid analysis can be observed. That is, in the fourth embodiment, the analysis result data and the analysis condition data, linked with the analysis object model data as the analysis object, can be simultaneously observed. Thus the analysis condition display system according to the fourth embodiment enables a more simple test with higher precision in comparison with the conventional test methods.

Fifth Embodiment

In the first to fourth embodiments, the analysis condition model data is displayed, however, the present invention is not limited to this arrangement. In the fifth embodiment, degree of reliability data in place of analysis condition model data is displayed. In the fifth embodiment, as an example, the degree of reliability model data of an arbitrary structure in VR space is presented on a flat display.

Figure 11:
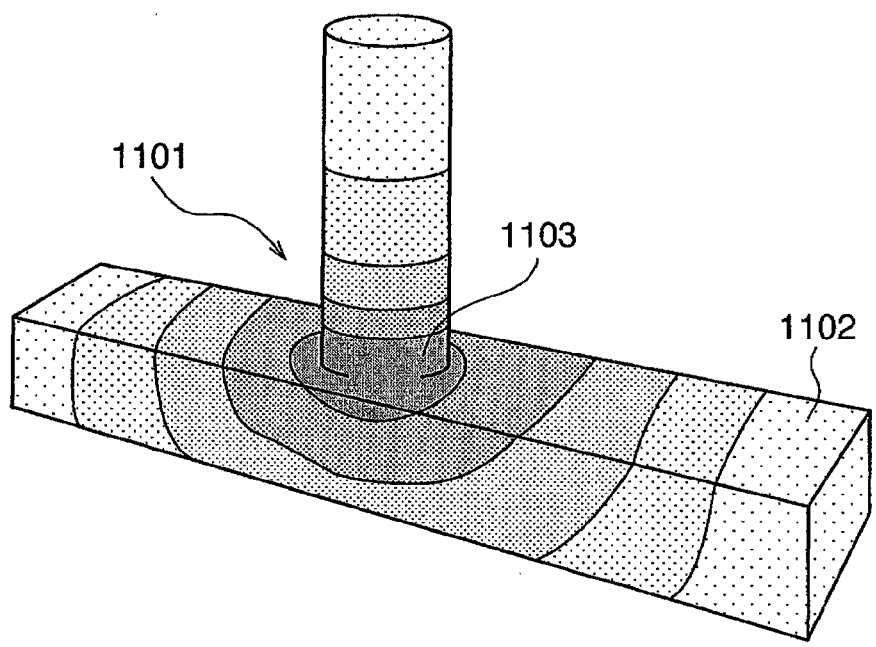
FIG. 11 is a display example of a degree of reliability model according to a fifth embodiment.

FIG. 11 is a display example of a degree of reliability model image based on degree of reliability data presented to the observation user. FIG. 11 shows a display of the result of rendering of a degree of reliability model 1101.

The outline of the fifth embodiment will be described using FIG. 11.

In FIG. 11, numeral 1101 denotes the degree of reliability model based on degree of reliability model data three-dimensionally visualized from degree of reliability data. In regions 1102 and 1103, the degree of reliability data are different in the degree of reliability model.

Note that the degree of reliability data is an index meaning the reliability of the entire analysis result calculated comprehensively using all the analysis condition data. As the numeric value of the degree of reliability data is high, the reliability of the analysis result is high. The degree of reliability model 1101 in the present embodiment is generated from degree of reliability data in some stress analysis.

The degree of reliability model 1101 is rendered while the chroma is changed by region in accordance with difference in degree of reliability data. A region 1102, in which the degree of reliability data is the lowest, is rendered with the lowest chroma. A region 1103, in which the degree of reliability data is the highest, is rendered with the highest chroma. That is, the degree of reliability model 1101 is representation of reliability by chroma distribution. In this example, the observation user can check the degree of reliability in each region by observing the chroma distribution of the degree of reliability model 1101. Accordingly, the observation user can easily check the reliability of the analysis simulation result by observing the degree of reliability model 1101.

Figure 12:
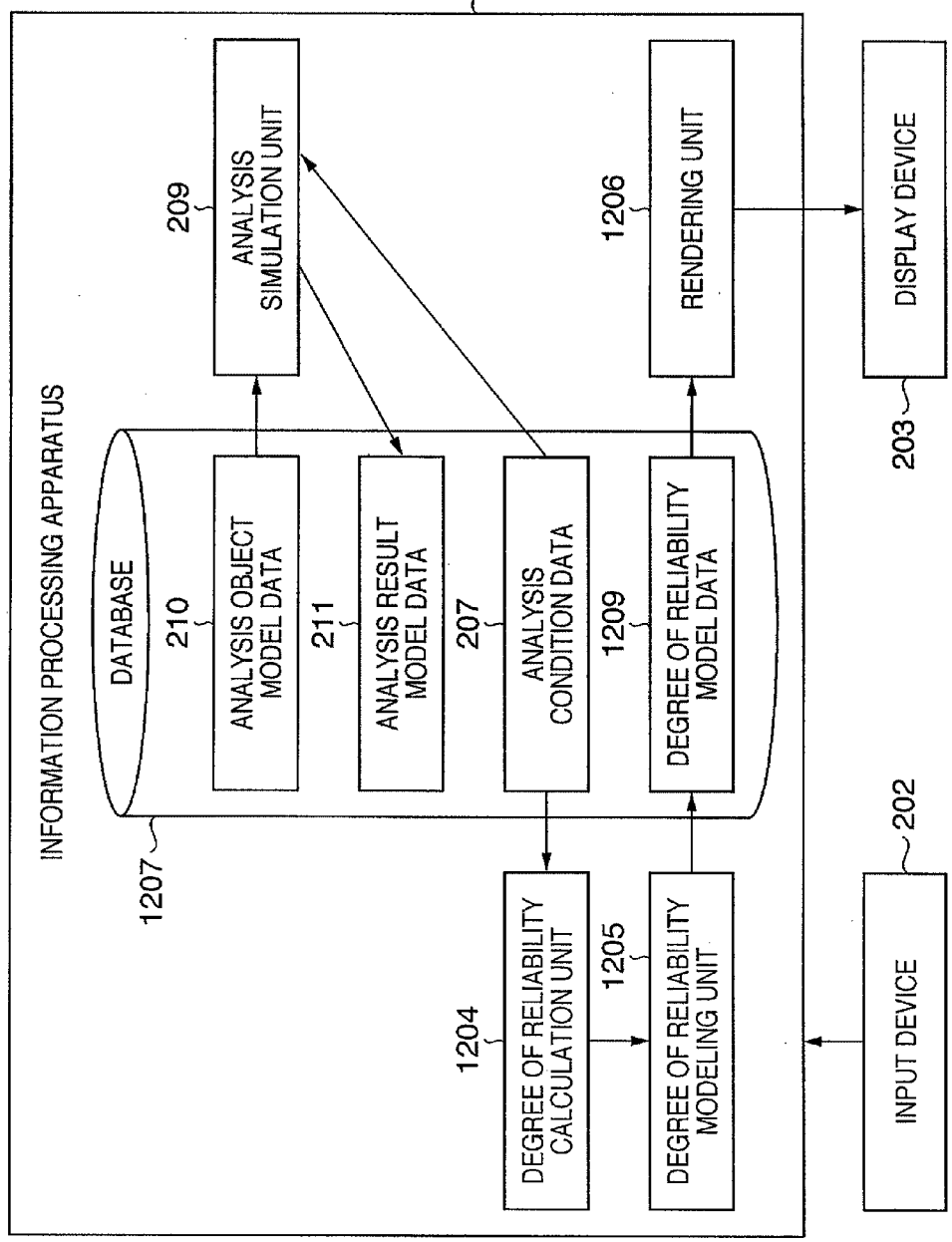
FIG. 12 is a block diagram showing the functional configuration to display the degree of reliability model according to the fifth embodiment.

Next, the functional elements of the fifth embodiment will be described with reference to FIG. 12. FIG. 12 is a block diagram showing the configuration of a system to three-dimensionally represent degree of reliability data indicating the reliability of analysis result and display the degree of reliability data on the display device 203. The degree of reliability data display system has the information processing apparatus 1201 to perform rendering on modeling data of degree of reliability data, the input device 202 to input a command into the information processing apparatus 1201, and the display device 203 to display model data rendered by the information processing apparatus 1201. The hardware configuration of the information processing apparatus 1201 is as shown in FIG. 2. Further, constituent elements corresponding to those in FIG. 3 have the same reference numerals.

Hereinbelow, the respective constituent elements of the present system will be described. In the information processing apparatus 1201, a degree of reliability calculation unit 1204 calculates degree of reliability data comprehensively using the analysis condition data 207 stored in a database 1207. The details of the calculation will be described later. A degree of reliability modeling unit 1205 performs calculation of three-dimensional modeling based on the degree of reliability data from the degree of reliability calculation unit 1204, thus generates degree of reliability model data 1209 three-dimensionally modeled from the degree of reliability data, and registers the degree of reliability model data 1209 into the database 1207. A rendering unit 1206 renders the degree of reliability model data 1209 registered in the database 1207 and displays the rendered degree of reliability model data 1209 on the display device 203. The database 1207 holds the analysis object model data 210, the analysis result model data 211, the analysis condition data 207 set upon execution of analysis simulation, and the degree of reliability model data 1209 obtained from the degree of reliability modeling unit 1205. The display device 203 which is a flat display, an HMD (Head Mount Display), a 3D display or the like, displays model data rendered by the information processing apparatus 1201 and the result of processing by the input device 202.

Figure 13:
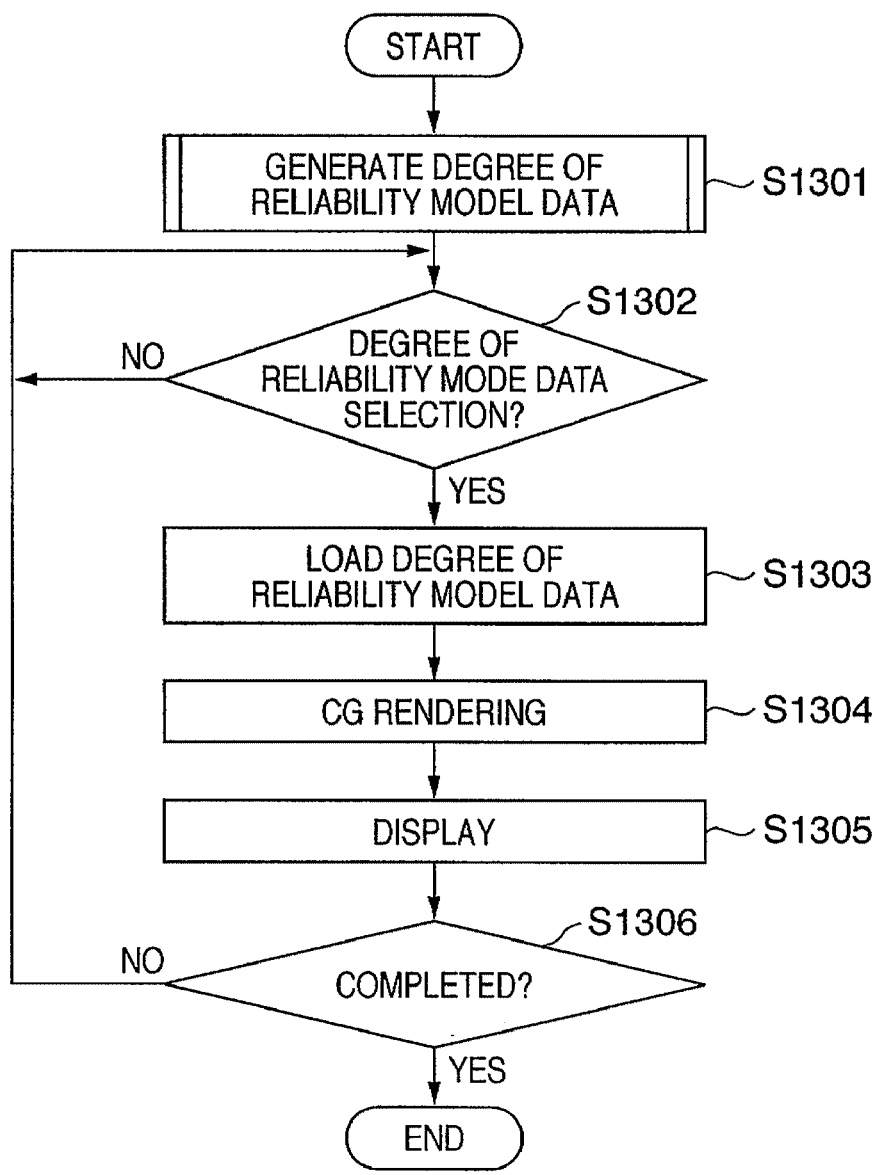
FIG. 13 is a flowchart showing degree of reliability model display processing according to the fifth embodiment.

Next, analysis condition model display processing according to the fifth embodiment will be described with reference to the flowchart of FIG. 13.

First, at step S1301, the degree of reliability calculation unit 1204 and the degree of reliability modeling unit 1205 generate the degree of reliability model data 1209 from the analysis condition data 207, and store the degree of reliability model data 1209 into the database 1207. This step S1301 will be described in detail later.

At step S1302, the CPU 5 determines whether or not a selection input of degree of reliability model data has been made from the input device 202. When it is determined that a selection input has been made, the process proceeds to step S1303, otherwise, step S1302 is repeated and the user's selection input is waited.

At step S1303, the rendering unit 1206 reads the degree of reliability model data 1209 selected at step S1302 from the database 1207. Note that the read data includes model shape data, arrangement data indicating position and attitude in the world coordinate system, and a model data list including model attribute data.

At step S1304, the rendering unit 1206 generates an object such as the degree of reliability model data 1209 read at step S1303 as an image viewed from the observation user's viewpoint. Then at step S1305, the rendering unit 1206 displays an image rendered at step S1304 on the display device 203.

Finally, at step S1306, the CPU 5 determines whether or not a processing termination instruction has been issued from the user. When it is determined that a termination instruction has been issued, the process is terminated, while when it is determined that no termination instruction has been issued, the process returns to step S1302, to repeat the processing at steps S1302 to 1306.

Next, the details of step S1301 will be described using FIG. 14.

Figure 14:
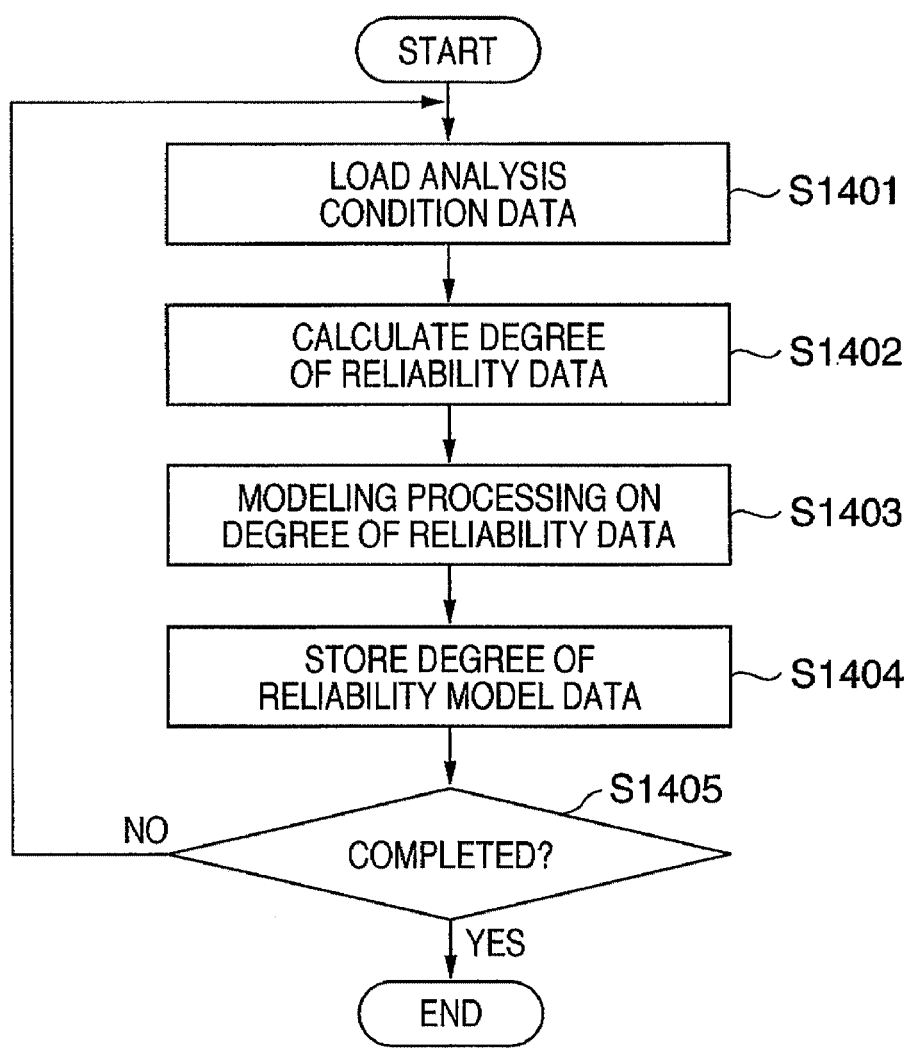
FIG. 14 is a flowchart showing degree of reliability model data generation processing according to a sixth embodiment.

FIG. 14 is a flowchart showing processing by the degree of reliability calculation unit 1204 and the degree of reliability modeling unit 1205 to generate the degree of reliability model data 1209 using the analysis condition data 207 in the database 1207.

First, at step S1401, the degree of reliability calculation unit 1204 reads the analysis condition data 207 from the database 1207. Next, at step S1402, the degree of reliability calculation unit 1204 calculates the degree of reliability data comprehensively using the analysis condition data 207 read at step S1401.

The degree of reliability data is comprehensively calculated by using an indexed value of the analysis condition data (various parameters such as model data shape, mesh division density, mechanical characteristic, physical characteristic, chemical characteristic, temperature distribution, shape difference between model data and mesh data, and an analysis boundary condition). For example, the degree of reliability data is calculated comprehensively as one index of analysis result using a value having an influence on the precision of analysis result among the respective analysis condition data. Otherwise, the respective analysis condition data are respectively weighted in correspondence with the content of the analysis simulation, and used in calculation of degree of reliability data.

For example, calculation of degree of reliability data a is as follows.

$$\alpha = (a \times A + b \times B + c \times C + d \times D)/\text{num}$$

Note that alphabet A is an index obtained from a mesh division density; a, a weight of the index A; B, an index obtained from a chemical characteristic; b, a weight of the index B; C, an index obtained from temperature distribution; c, a weight of the index C; D, an index obtained from analysis boundary condition; d, a weight of the index D; and num, the number of analysis conditions used in calculation of the degree of reliability data $\alpha$. In this manner, the degree of reliability data $\alpha$ is comprehensively calculated using the respective analysis conditions. Note that as the analysis condition data is set in each region of model data, the degree of reliability data is also calculated for each region.

The degree of reliability calculation unit 1204 outputs the degree of reliability data calculated as above to the degree of reliability modeling unit 1205.

At step S1403, the degree of reliability modeling unit 1205 performs modeling on the degree of reliability data calculated at step S1402 as three-dimensional model data, thereby generates the degree of reliability model data 1209. More particularly, modeling is performed on the analysis object model data 210 while the chroma is changed by region in accordance with difference in degree of reliability data calculated at step S1402. For example, in an analysis object model represented with the analysis object model data 210, the degree of reliability model data 1209 is generated by rendering a region with high reliability with a high chroma color, and rendering a region with low reliability with a low chroma color.

Next, at step S1404, the information processing apparatus 1201 registers the degree of reliability model data 1209 generated at step S1403 into the database 1207. The format of the registered data includes model shape data, arrangement data indicating the position and attitude in the world coordinate system, and a model data list including model attribute data.

Finally, at step S1405, the degree of reliability calculation unit 1204 and the degree of reliability modeling unit 1205 determine whether or not a processing termination instruction has been issued from the user. When it is determined that a termination instruction has been issued, the present process is terminated, while when it is determined that no termination instruction has been issued, the process returns to step S1401 to repeat the above steps S1401 to 1405.

As described above, according to the fifth embodiment, the degree of reliability calculation unit 1204 calculates the degree of reliability of analysis simulation in each region of the three-dimensional model represented with the analysis result model data 211, based on the analysis condition data 207. Then the degree of reliability modeling unit 1205 assigns the degree of reliability calculated by the degree of reliability calculation unit 1204 to each region of the three-dimensional model represented with the analysis result model data 211, thereby generates the degree of reliability model 1209. The rendering unit 1206 renders the three-dimensional model based on the generated degree of reliability model data 1209, and displays the three-dimensional model on the display device 203. According to the degree of reliability model data display method according to the fifth embodiment, the degree of reliability data can be displayed with three-dimensional chroma distribution. That is, the observation user can easily check the degree of reliability data as an index of the reliability of analysis result not back in the phase of execution of the analysis simulation by the analysis user.

As described above, according to the above-described embodiments, a test with higher certainty can be realized by three-dimensionally visualizing the degree of reliability the analysis conditions and the degree of reliability comprehensively calculated from the respective analysis conditions. That is, by visualization of analysis condition, even the observation user who is not an analysis specialist can intuitively check the analysis condition set by the analysis user. Further, by visualization of the degree of reliability, the observation user can easily and intuitively check the degree of reliability of analysis result. Further, as the degree of reliability is three-dimensionally visualized by region, not only the reliability of the entire analysis result but also the reliability of analysis result by region can be checked.

According to the present invention, upon display in analysis simulation, the precision of analysis result can be intuitively grasped.

In addition to the embodiments described as above, the present invention is applicable to a system, an apparatus, a method, a program, a storage medium and the like. More particularly, the present invention can be applied to a system constituted by a plurality of devices or to an apparatus comprising a single device.

Further, the present invention includes a case in which the functions of the above-described embodiments are realized by supplying a software program directly or remotely to a system or an apparatus, reading the supplied program with a computer of the system or apparatus and executing the program. In this case, the supplied program corresponds to the flowcharts shown in the figures in the embodiments.

Accordingly, the program code itself installed in the computer to realize the functional processing of the present invention realizes the present invention. That is, the present invention includes the computer program itself to realize the functional processing of the present invention.

In this case, so long as the system or apparatus has the functions of the program, the program may be executed in any form, such as an object code, a program executed by an interpreter, or script data supplied to an operating system.

Example of storage media that can be used for supplying the program are a floppy (registered trademark) disk, a hard disk, an optical disk, a magneto-optical disk, an MO, a CD-ROM, a CD-R, a CD-RW, a magnetic tape, a non-volatile type memory card, a ROM, and a DVD (a DVD-ROM and a DVD-R).

As for the method of supplying the program, a client computer can be connected to a website on the Internet using a browser of the client computer, and the computer program of the present invention or an automatically-installable compressed file of the program can be downloaded to a recording medium such as a hard disk. Further, the program of the present invention can be supplied by dividing the program code constituting the program into a plurality of files and downloading the files from different websites. That is, a WWW (World Wide Web) server that downloads, to multiple users, the program files that implement the functions of the present invention by computer is also included in the present invention.

It is also possible to encrypt and store the program of the present invention on a storage medium such as a CD-ROM, distribute the storage medium to users, allow users who meet certain requirements to download decryption key information from a website via the Internet, and allow these users to decrypt the encrypted program by using the key information, whereby the program is installed in the user computer.

Besides the cases where the aforementioned functions according to the embodiments are implemented by executing the read program by the computer, an OS or the like running on the computer may perform all or a part of the actual processing so that the functions of the foregoing embodiments can be implemented by this processing.

Furthermore, after the program read from the storage medium is written to a function expansion board inserted into the computer or to a memory provided in a function expansion unit connected to the computer, a CPU or the like mounted on the function expansion board or function expansion unit performs all or a part of the actual processing so that the functions of the foregoing embodiments can be implemented by this processing.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-022235, filed Jan. 31, 2007, which is hereby incorporated by reference herein in its entirety.

What is claimed is:

1. A control method for an analyzation apparatus to perform a stress analysis simulation in accordance with analysis condition data as mesh density, comprising:

a target model acquisition step of acquiring analysis target model data which is target of the stress analysis;

a condition model generation step of generating analysis condition model data by assigning analysis condition data as mesh density to each region of a three-dimensional solid model represented with the analysis target model data;

an analysis step of performing the stress analysis simulation in accordance with the analysis condition model data generated in the condition model generation unit;

a result model generation step of generating analysis result model data which have both of first visual appearance indicating the mesh density which assigned to each region of the three-dimensional solid model, the first visual appearance expressed by transparency, and second visual appearance indicating a stress distribution as the result of analysis in the analysis step, the second visual appearance expressed by color;

a display step of displaying the three-dimensional solid model represented with said analysis result model data; and a repeating step of repeating the performing in the analysis step, the generating in the result model generation step, and the displaying in the display step, in accordance with new analysis condition data.

2. The method according to claim 1, further comprising a detection step of detecting a region designated by a user in the three-dimensional model displayed at said display step, wherein at said display step, a value of mesh density assigned to the region detected at said detection step is further displayed.

3. An analyzation apparatus which performs a stress analysis simulation in accordance with analysis condition data as mesh density, comprising:

a target model acquisition unit configured to acquire analysis target model data which is target of the stress analysis;

a condition model generation unit configured to generate analysis condition model data by assigning analysis condition data as mesh density to each region of a three-dimensional solid model represented with the analysis target model data;

an analysis unit configured to perform the stress analysis simulation in accordance with the generated the analysis condition model;

a result model generation unit configured to generate analysis result model data by an which have both of first visual appearance indicating the mesh density which assigned to each region of the three-dimensional solid model, the first visual appearance expressed by transparency, and second visual appearance indicating a stress distribution as the result of analysis in the analysis unit, the second visual appearance expressed by color;

a display unit configured to display the three-dimensional solid model represented with said analysis result model data; and a repeating unit configured to repeat the performing in the analysis unit, the generating in the result model generation unit, and the displaying in the display unit, in accordance with new analysis condition data.

4. A non-transitory computer-readable storage medium holding a control program to cause a computer to perform the control method in claim 1.

\* \* \* \* \*